United States Patent
Yokoyama et al.

(10) Patent No.: US 7,205,964 B1
(45) Date of Patent: Apr. 17, 2007

(54) LIGHT SOURCE AND DISPLAY DEVICE (75) Inventors: Osamu Yokoyama, Suwa (JP); Satoru Miyashita, Suwa (JP); Tatsuya Shimoda, Suwa (JP); Yasunori Taga, Aichi-gun (JP); Shizuo Tokito, Aichi-gun (JP); Koji Noda, Aichi-gun (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/530,099

(22) PCT Filed: Apr. 25, 2000

(86) PCT No.: PCT/JP99/04752

§ 371 (c)(1),
(2), (4) Date: Apr. 25, 2000

(87) PCT Pub. No.: WO00/15009

PCT Pub. Date: Mar. 16, 2000

(30) Foreign Application Priority Data

Sep. 2, 1998 (JP) .................................. 10/248773
Sep. 2, 1998 (JP) .................................. 10/248774

(51) Int. Cl.
G09G 3/30 (2006.01)

(52) U.S. Cl. .............................. 345/76; 345/80; 349/69

(58) Field of Classification Search .................. 345/32, 345/45, 76–81, 214–215, 36, 102; 315/169.3; 349/69, 70, 76, 96; 257/57, 60; 313/500, 313/501, 504, 506
See application file for complete search history.

(56) References Cited

U.S. PATENT DOCUMENTS 5,144,203 A * 9/1992 Fujita et al. ............. 315/169.3
5,146,354 A * 9/1992 Plesinger ..................... 349/59
5,185,712 A * 2/1993 Sato et al. ............. 348/333.08
5,294,870 A * 3/1994 Tang et al. .................. 313/504
5,567,042 A * 10/1996 Farchmin et al. ........... 362/241
5,587,589 A * 12/1996 So et al. ....................... 257/40
5,589,320 A * 12/1996 Ohnishi et al. ............. 430/321

(Continued)

FOREIGN PATENT DOCUMENTS

EP 0 838 715 4/1998

(Continued)

OTHER PUBLICATIONS

T. Rivera et al., "Reduced Threshold All-Optical Bistability in Etched Quantum Well Microresonators," Appl. Phys. Letter 64(7) Feb. 14, 1994, pp. 869-871.*

(Continued)

Primary Examiner—Richard Hjerpe
Assistant Examiner—Abbas Abdulselam
(74) Attorney, Agent, or Firm—Oliff & Berridge, PLC (57) ABSTRACT

The invention provides electroluminescent (EL) elements, such that a red EL light source, a green EL light source and a blue EL light source emit red color light, green color light, and blue color light, respectively, and are disposed at the rear of liquid crystal display elements. Each EL light source includes an organic EL element in which an organic thin film emits light. Each EL light source has a structure in which an organic luminescent layer is sandwiched between an indium tin oxide (ITO) electrode and a metal electrode which have striped patterns which are orthogonal to each other, and sections (luminescent sections) at which the striped patterns of the ITO electrode and the metal electrode intersect with each other emit light. The luminescent sections are arrayed two-dimensionally on a glass substrate and illuminate the entire display area of the liquid crystal display element.

8 Claims, 9 Drawing Sheets

U.S. PATENT DOCUMENTS

| | | | |
|---|---|---|---|
| 5,629,784 A * | 5/1997 | Abileah et al. | 349/112 |
| 5,650,640 A * | 7/1997 | Stafford et al. | 257/81 |
| 5,656,508 A * | 8/1997 | So et al. | 438/34 |
| 5,674,636 A * | 10/1997 | Dodabalapur et al. | 428/690 |
| 5,688,551 A * | 11/1997 | Littman et al. | 427/64 |
| 5,693,962 A * | 12/1997 | Shi et al. | 257/89 |
| 5,703,394 A * | 12/1997 | Wei et al. | 257/433 |
| 5,707,745 A * | 1/1998 | Forrest et al. | 428/432 |
| 5,723,950 A | 3/1998 | Wei et al. | |
| 5,736,754 A * | 4/1998 | Shi et al. | 257/89 |
| 5,747,363 A * | 5/1998 | Wei et al. | 438/5 |
| 5,747,938 A | 5/1998 | Beard | |
| 5,754,262 A * | 5/1998 | Lengyel | 349/104 |
| 5,779,937 A * | 7/1998 | Sano et al. | 252/310.16 |
| 5,847,506 A * | 12/1998 | Nakayama et al. | 313/504 |
| 5,886,464 A * | 3/1999 | Shi et al. | 313/503 |
| 5,929,562 A * | 7/1999 | Pichler | 313/506 |
| 6,008,578 A * | 12/1999 | Chen | 313/506 |
| 6,025,894 A * | 2/2000 | Shirasaki et al. | 349/69 |
| 6,035,180 A * | 3/2000 | Kubes et al. | 455/90 |
| 6,037,712 A * | 3/2000 | Codama et al. | 313/498 |
| 6,091,382 A * | 7/2000 | Shioya et al. | 345/76 |
| 6,107,734 A * | 8/2000 | Tanaka et al. | 313/506 |
| 6,107,736 A * | 8/2000 | Shi et al. | 313/509 |
| 6,133,691 A * | 10/2000 | Nakayama et al. | 313/504 |
| 6,160,346 A * | 12/2000 | Vleggaar et al. | 313/512 |
| 6,195,142 B1 * | 2/2001 | Gyotoku et al. | 349/69 |
| 6,215,250 B1 * | 4/2001 | Hirano et al. | 315/169.3 |
| 6,225,741 B1 * | 5/2001 | Nakamura et al. | 313/506 |
| 6,607,277 B2 * | 8/2003 | Yokoyama et al. | 353/52 |

FOREIGN PATENT DOCUMENTS

| | | |
|---|---|---|
| JP | 51-119243 | 10/1976 |
| JP | 62-125326 * | 6/1987 |
| JP | A-4-67596 | 3/1992 |
| JP | A-5-307996 | 11/1993 |
| JP | A-6-301355 | 10/1994 |
| JP | A-6-342690 | 12/1994 |
| JP | A-7-134558 | 5/1995 |
| JP | A-7-230880 | 8/1995 |
| JP | 09188875 A * | 5/1997 |
| JP | A-9-115673 | 5/1997 |
| JP | WO97/43686 | 11/1997 |
| JP | A-9-326297 | 12/1997 |
| JP | 10-199679 | 7/1998 |
| JP | 10-207395 * | 8/1998 |
| JP | A-11-67448 | 3/1999 |
| WO | WO 97/43868 | 11/1997 |

OTHER PUBLICATIONS

A. Scherer et al., "Fabrication of Microlasers and Microresonator Optical Switches," Appl. Phys. Letter 55 (26), Dec. 25, 1980, pp. 2724-2726.*

"Electro-luminescent Backlight for Color Display", IBM Technical Disclosure Bulletin, v. 35, No. 2, Jul. 1992, pp. 433-434.

* cited by examiner

LIGHT SOURCE AND DISPLAY DEVICE

BACKGROUND OF THE INVENTION

1. Field of the Invention

The present invention relates to a light source for illuminating a display element and to a method for operating the same, and also relates to a display device or a display apparatus for performing display by illuminating a display element by the light source.

2. Description of Related Art

With respect to a technique for reducing the size of a projection liquid crystal display device which performs display by enlarging and projecting an image of a liquid crystal display element, Japanese Unexamined Patent Application Publication No. 51-119243 can be referred to. This publication discloses the structure of a display device in which a liquid crystal display element is illuminated by a planar light source, such as an electroluminescent element (hereinafter referred to as "EL element"), and an image displayed in the liquid crystal display element is enlarged and projected onto a screen by a lens.

Recently, with the development of organic EL elements having organic thin films as luminescent layers, the luminance is significantly increasing. An organic EL element can be an effective light source for constructing a small projection liquid crystal display device with increased brightness.

However, when the organic EL element is continuously operated with increased luminance, the luminance becomes greatly decreased. One of the reasons for this is believed to be that heat is generated by a current supplied for operating the organic EL element, and the accumulated heat increases the temperature of the element, resulting in changes in the structure and characteristics of the organic thin film.

On the other hand, as a conventional technique for suppressing a decrease in luminance of an organic EL element, Japanese Unexamined Patent Application Publication No. 7-230880 discloses a technique in which an organic EL element is operated in a pulsed mode.

With respect to a display device in which a liquid crystal display element is illuminated by three organic EL elements for emitting red, green, and blue light corresponding to the three primary colors and an image displayed in the liquid crystal display element is enlarged for display, each organic EL element must emit light at a luminance as high as approximately 10,000 $cd/m^2$, and in order to correct the color balance according to a change in luminance of each color, the luminance of each organic EL element must be controlled independently.

SUMMARY OF THE INVENTION

The present invention has been achieved in view of the problems described above, and it is a first object of the present invention to provide a display device in which the accumulation of heat in a light source is suppressed, a decrease in luminance is suppressed, and a decrease in brightness of a display image is reduced using the light source.

It is a second object of the present invention to provide a display device, in particular, of the enlarged-display type, in which a decrease in luminance of a display image is reduced and the color balance can be corrected.

The first object described above is achieved by a light source or a display device according to any one of features (1) to (7) described below.

(1) A light source includes a plurality of organic electroluminescent elements one-dimensionally or two-dimensionally arrayed on the same substrate. The plurality of organic electroluminescent elements emit light simultaneously.

In the light source according to (1), the accumulation of heat, which is generated when the light source for illuminating a wide area emits light, can be suppressed, and a decrease in the brightness of the light source can be suppressed.

(2) In a light source according to (1), the plurality of organic electroluminescent elements emit light of one primary color out of the three primary colors.

The light source according to (2) is a light source for emitting monochromatic light.

(3) In a light source according to either (1) or (2), the organic electroluminescent elements include optical microresonators.

In the light source according to (3), the peak of the intensity occurs in a specific wavelength, and light having strong directivity toward the front can be emitted.

(4) In a light source according to any one of (1) to (3), the organic electroluminescent elements are formed on the substrate at the intersections of an anode formed in a striped pattern in a first direction and a cathode formed in a striped pattern in a second direction orthogonal to the first direction.

In the light source according to (4), a light source having a simple structure in which luminescent elements are two-dimensionally arrayed discretely can be obtained easily.

(5) In a light source according to any one of (1) to (3), luminescent sections are one-dimensionally arrayed on the substrate.

In the light source according to (5), the area of the luminescent region is increased and the accumulation of heat during light emission is suppressed, and thus high luminance can be maintained.

(6) A display device illuminates a display element by a light source according to any one of (1) to (5).

In the above display device, a high-performance display device can be obtained in which a decrease in luminance is lowered due to the features of the light source.

(7) In a display device according to (6), D is 10 times P or more, where P is a distance between the adjacent organic electroluminescent elements and D is a distance between each organic electroluminescent element and the display surface of the display element.

In the above display device, the spatial uniformity of illumination light for illuminating the display surface of the display element can be improved.

(8) In a display device according to either (6) or (7), the display element is a liquid crystal display element.

The above display device has high luminance in a simple structure.

The second object of the present invention is achieved by a display device according to any one of features (9) to (16) described below.

(9) A display device includes a light source that may include an organic electroluminescent element, a display element illuminated by the light source, and an optical system for enlarging and displaying an image displayed in the display element. The organic electroluminescent element has a luminescent region having substantially the same size as that of a display area of the display element, and a pulse current is applied to the organic electroluminescent element to cause light emission.

In the display device according to (9), a rise in the temperature of the element due to the accumulation of heat in the organic electroluminescent element can be suppressed, and a decrease in luminance, namely, a decrease in the brightness of a display image, can be suppressed.

(10) A display device includes a light source that may include a first organic electroluminescent element for emitting light in a red color range, a second organic electroluminescent element for emitting light in a green color range, and a third organic electroluminescent element for emitting light in a blue color range; first, second, and third display elements illuminated by their corresponding organic electroluminescent elements; a combining optical system for combining images displayed in the first, second, and third display elements; and an optical system for enlarging and displaying the image combined by the combining optical system. The first, second, and third organic electroluminescent elements have luminescent regions with substantially the same sizes as those of display areas of the first, second, and third display elements, respectively, and a pulse current is applied to each of the first, second, and third organic electroluminescent elements to cause light emission.

The display device according to (10) is particularly suitable for a display device in which the display image has high resolution. A rise in the temperature of the element due to the accumulation of heat in the organic electroluminescent elements as the light source can be suppressed, and a decrease in luminance, namely, a decrease in the brightness of the display image, can be suppressed.

(11) A display device includes a light source that may include a first organic electroluminescent element for emitting light in a red color range, a second organic electroluminescent element for emitting light in a green color range, and a third organic electroluminescent element for emitting light in a blue color range; a combining optical system for combining light emitted from the individual organic electroluminescent elements; a display element illuminated by the light combined by the combining optical system; and an optical system for enlarging and displaying the image displayed in the display element. The first, second, and third organic electroluminescent elements have luminescent regions with substantially the same size as that of the display area of the display element, respectively, and a pulse current is applied to each of the first, second, and third organic electroluminescent elements to cause light emission.

In the display device according to (11), a color image is projected using a single display element. A rise in the temperature of the element due to the accumulation of heat in the organic electroluminescent elements as the light source can be suppressed, and a decrease in luminance, namely, a decrease in the brightness of the display image, can be suppressed.

(12) In a display device according to any one of (9) to (11), the display element is a liquid crystal display element.

In the above display device, high-resolution display in a simple structure is enabled.

(13) In a display device according to any one of (9) to (11), in order to adjust the luminance of the organic electroluminescent elements, at least one of the peak current, the frequency, and the pulse width of the pulse current is controlled.

In the above display device, a decrease in the luminance of the light source is compensated for so that the luminance can be maintained for a certain period of time.

(14) In a display device according to (10) or (11), in order to adjust the color of the display image, at least one of the peak current, the frequency, and the pulse width of the pulse current applied to each of the first, second, and third organic electroluminescent elements is controlled independently.

In the above display device, the luminance of the light source for each color can be adjusted independently, and thus the color balance can be adjusted.

(15) In a display device according to (9) to (14), the organic electroluminescent elements have optical microresonator structures.

In the above display device, the purity of colors in the display image can be increased and the utilization efficiency of light can be improved.

(16) In a display device according to (10) or (11), a pulse is applied to each of the first, second, and third organic electroluminescent elements with the same timing.

In the above display device, the balance of displayed color is improved.

Furthermore, in accordance with the present invention, display devices according to (17) to (19) described below are provided.

(17) A display device includes a light source including a plurality of organic electroluminescent elements one-dimensionally or two-dimensionally arrayed on the same substrate, the plurality of organic electroluminescent elements emitting light simultaneously, a display element illuminated by the light source, and an optical system for enlarging and displaying an image displayed in the display element. A pulse current is applied to the organic electroluminescent elements in the light source to cause light emission.

(18) A display device includes a first light source including a plurality of first organic electroluminescent elements one-dimensionally or two-dimensionally arrayed on the same substrate for emitting light in a red color range, the plurality of organic electroluminescent elements emitting light simultaneously, a second light source including a plurality of second organic electroluminescent elements one-dimensionally or two-dimensionally arrayed on the same substrate for emitting light in a green color range, the plurality of organic electroluminescent elements emitting light simultaneously, a third light source including a plurality of third organic electroluminescent elements one-dimensionally or two-dimensionally arrayed on the same substrate for emitting light in a blue color range, the plurality of organic electroluminescent elements emitting light simultaneously, at least one display element illuminated by the light sources including the organic electroluminescent elements, and an optical system for enlarging and displaying an image formed by the display element. A pulse current is applied to each of the organic electroluminescent elements so that the organic electroluminescent elements in the first light source, the organic electroluminescent elements in the second light source, and the third organic electroluminescent elements in the third light source emit light.

(19) In a display device according to (18), a pulse is applied to each of the first, second, and third organic electroluminescent elements with the same timing.

In the display device according to any one of (17) to (19), advantages are achieved more remarkably, in that a rise in the temperature of the elements due to the accumulation of heat in the organic electroluminescent elements can be suppressed, and a decrease in luminance, namely, a decrease in the brightness of the display image, can be suppressed.

DESCRIPTION OF THE PREFERRED EMBODIMENTS

Embodiments of light sources and display devices in the present invention will now be described with reference to the drawings.

Figure 1:
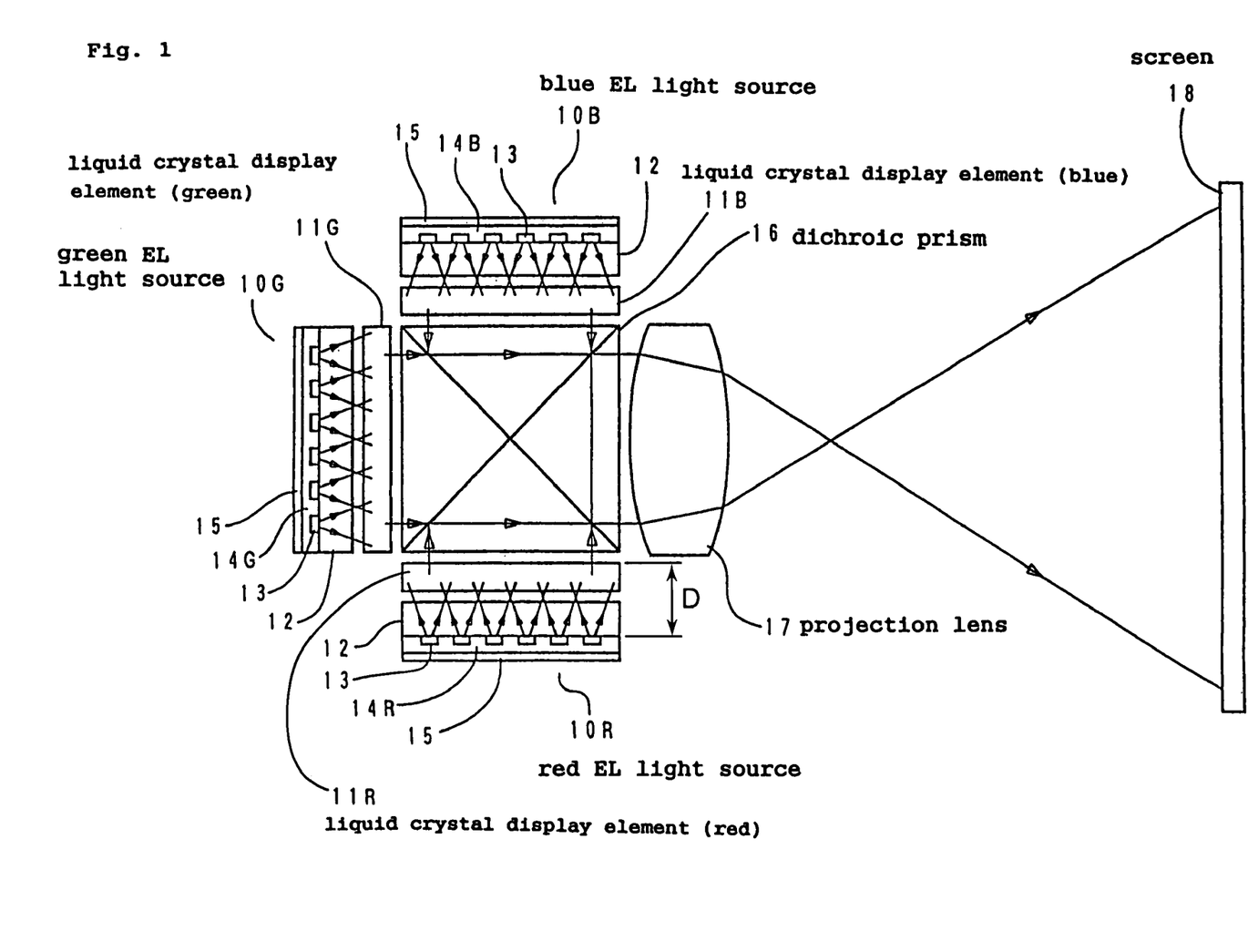
FIG. 1 is a sectional view showing a light source and a major optical system in a display device in accordance with a first embodiment of the present invention.
Figure 2:
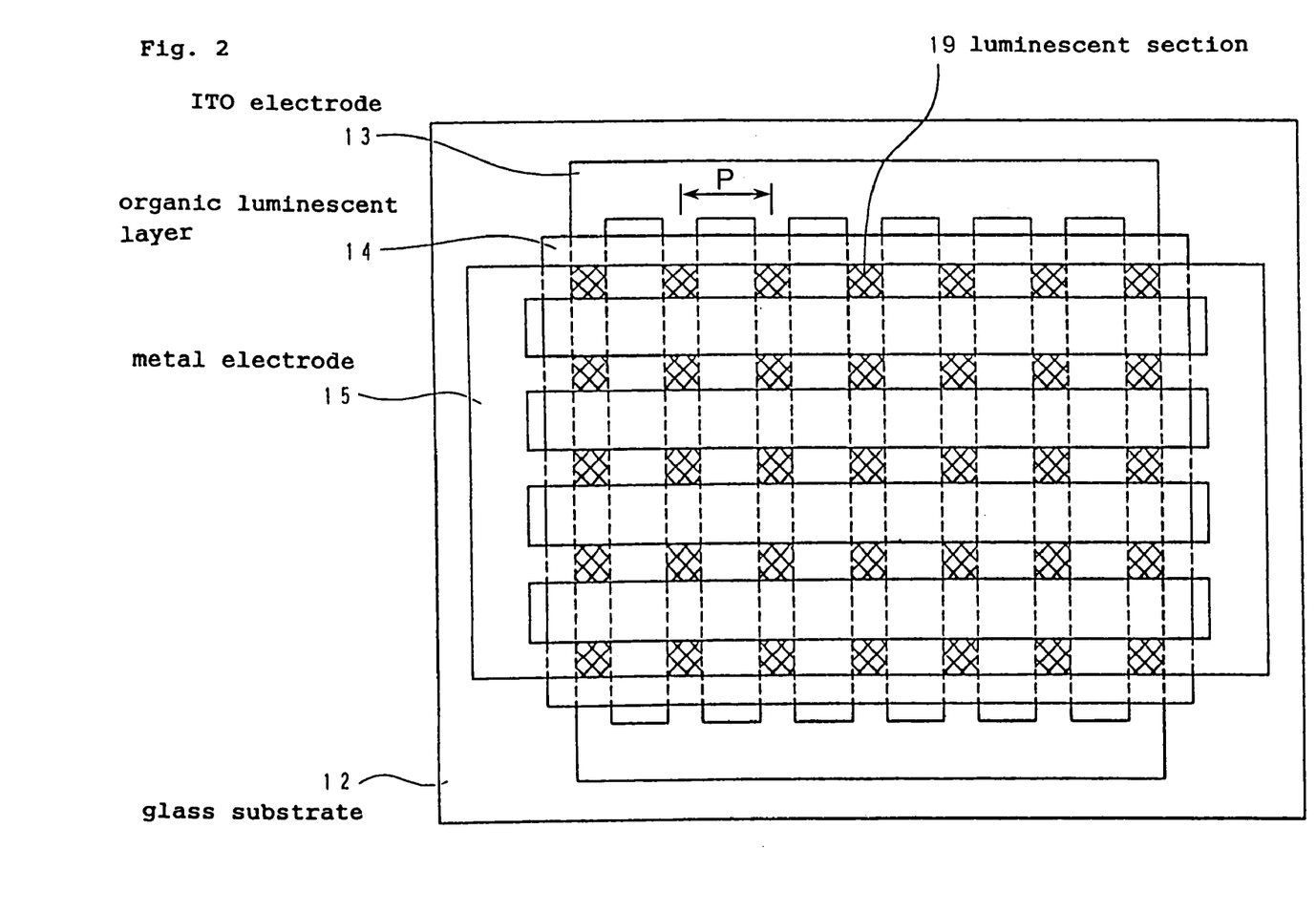
FIG. 2 is a plan view showing the structure of the light source in accordance with the first embodiment of the present invention.

First, a first embodiment will be described based on FIGS. 1 and 2. FIG. 1 is a sectional view of a major optical system constituting a projection liquid crystal display device as a display device in accordance with this embodiment, and FIG. 2 is a plan view showing the structure of a light source that includes organic EL elements. Although only 7 pieces across and 5 pieces down of luminescent sections 20 that include the organic EL elements are depicted to facilitate viewing in FIG. 2, the actual array includes many more luminescent sections.

In the structure shown in FIG. 1, a liquid crystal display element 11R for displaying a red-component image, a liquid crystal display element 11G for displaying a green-component image, and a liquid crystal display element 11B for displaying a blue-component image are disposed opposite to the corresponding faces of a dichroic prism 16.

A red EL light source 10R that includes red organic EL elements, which are two-dimensionally arrayed, for emitting light at a wavelength in the red range is disposed at the rear of the liquid crystal display element 11R for displaying the red-component image, a green EL light source 10G that includes green organic EL elements, which are two-dimensionally arrayed, for emitting light at a wavelength in the green range is disposed at the rear of the liquid crystal display element 11G for displaying the green-component image, and a blue EL light source 10B that includes blue organic EL elements, which are two-dimensionally arrayed, for emitting light at a wavelength in the blue range is disposed at the rear of the liquid crystal display element 11B for displaying the blue-component image.

Images displayed in the individual liquid crystal display elements are illuminated by the EL light sources for emitting light of the corresponding colors, and a color image is combined by the dichroic prism 16. The color image is enlarged by a projection lens 17 and projected to a screen 18 as an enlarged image.

As shown in FIG. 2, each light source has a layered structure including an ITO electrode 13 composed of an ITO (indium tin oxide) thin film formed on a glass substrate 12, an organic luminescent layer 14 having a layered structure including organic thin films, such as a hole-transporting layer, a luminescent layer, and an electron-transporting layer, and a metal electrode 15 composed of, for example, an alloy containing Mg (magnesium) and Ag (silver). The above layered structure is sealed with another substrate so as to avoid being brought into contact with moisture and dust.

Each of the ITO electrode 13 and the metal electrode 15 has a striped pattern and both patterns are orthogonal to each other. In each light source, sections at which the pattern of the ITO electrode 13 and the pattern of the metal electrode 15 intersect with each other correspond to luminescent sections 19. The ITO electrode 13 acts as an anode, the metal electrode 15 acts as a cathode, and a current is fed to the organic luminescent layer 14 by a voltage applied between the two electrodes, and thus the light source emits light.

The patterns of the ITO electrode, the organic luminescent layer, and the metal electrode are not limited to those described above, and any pattern in which the luminescent sections 19 are two-dimensionally arrayed with a separation therebetween may be advantageously used.

A dielectric multilayered film, in which, preferably, $SiO_2$ and $TiO_2$ are deposited in turn, is formed between the glass substrate 12 and the ITO electrode 13. By constructing an optical micro-resonator with the dielectric multilayered film and the metal electrode 15, light emitted from the luminescent section 19 can be set to have a sharp peak at a specific wavelength (for example, at 620 nm in the red organic EL element, at 535 nm in the green organic EL element, and at 470 nm in the blue organic EL element) and to have strong directivity toward the front. By using such organic EL elements, the purity of color displayed in the display device can be increased and a bright display device, in which the light loss while passing through the optical system is decreased, can be obtained.

As the light source emit lights, heat is generated at the luminescent sections 19 and heat is generated by a current flowing through the ITO electrode 13 and the metal electrode 15. When the ITO electrode, the organic luminescent layer, and the metal electrode are formed entirely over the region having substantially the same area as the display area in the liquid crystal display element, there is no escape for the heat, and a large accumulation of heat occurs in the glass substrate, or the like. On the other hand, by discretely arraying the luminescent sections as is done in this embodiment, the accumulation of heat is relieved, and a rise in the temperature of the organic EL elements can be relieved. Accordingly, it is possible to suppress the deterioration of the organic EL element as the light source.

Furthermore, although not shown in the drawing, it may be effective to provide, for example, a highly conductive thick film of aluminum, copper, gold, silver, or the like on the metal electrode 15 with an insulating film therebetween to form a heat dissipation path. In particular, a heat-transfer line is preferably provided in a space between the luminescent sections 19 to form the heat dissipation path.

In the liquid crystal display element, in order to illuminate the display area that extends two-dimensionally, it is preferable that the luminance of light emitted from the luminescent sections which are discretely spatially disposed be made spatially uniform. For that purpose, a distance D between the luminescent sections 19 and the display surface of a liquid crystal display element 11 is increased in relation to a distance P between the adjacent luminescent sections 19 in the light source. For example, D is preferably set at 10 times P or more.

Next, specific numerical examples will be described. With respect to each of the liquid crystal display elements 11R, 11G, and 11B, the size of the display area thereof is set at 0.9 inch measured diagonally (18.3 mm in width and 13.7 mm in length). In each of the EL light sources 10R, 10G, and 10B, the distance P between the adjacent luminescent sections 19 (distance between the centers of the adjacent luminescent sections 19) is set at 0.3 mm, and the width of each of the ITO electrode 13 and the metal electrode 15 having a striped pattern is set at 0.1 mm. In such a case, the luminescent section 19 has a size of 0.1 mm×0.1 mm. In order to uniformly illuminate up to the periphery of the display area, the region in which the luminescent sections 19 lie must be larger than the display area. For example, the size of the luminescent region is set at 20 mm in width and 15 mm in length. The region contains approximately 66×50 pieces of the luminescent sections 19. The thickness of the glass substrate 12 in each EL light source is set at 1 mm. The distance D between the luminescent sections 19 and the surface of each of the liquid crystal display elements 11R, 11G, and 11B is required to be set to 10 times the distance P between the adjacent luminescent sections 19 or more, and for example, is set at 3.5 mm.

The display device of the present invention may be applicable to a head mounted display and a head-up display, in addition to the projection liquid crystal display device described above in the first embodiment. Furthermore, a display element other than the liquid crystal display element may be employed. Although the light sources for emitting light in red, green, and blue are used in the embodiment, it may be possible to construct a display device using one or two light sources of the red, green, and blue EL light sources, depending on the color to be displayed.

Figure 3:
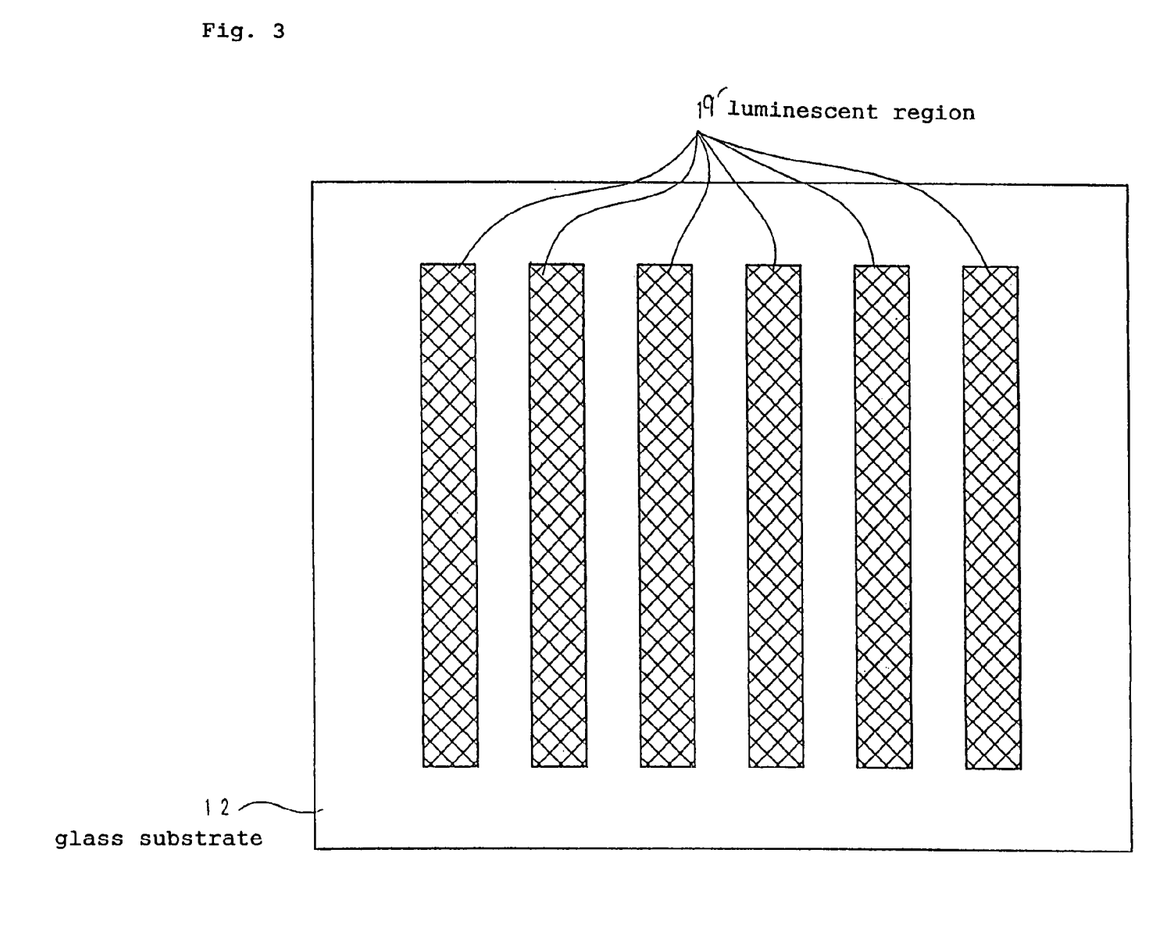
FIG. 3 is a plan view showing a variation of the structure of the light source in accordance with the first embodiment of the present invention.

In the present invention, a light source includes an array of organic EL elements. Although the light source in which organic EL elements are two-dimensionally arrayed is described in the first embodiment, by one-dimensionally arraying organic EL elements depending on the application, a structure in which luminescent sections (regions) 19' are one-dimensionally arrayed, as shown in FIG. 3, may be employed. In such a case, in comparison with the case in which luminescent sections are two-dimensionally arrayed, the luminance of the entire light source is increased, and heat dissipation from the organic EL elements can be secured. In this case, more preferably, a heat-transfer region with high heat-transfer material is also provided in a space in the luminescent regions to form a heat dissipation path.

As described above, the light source in accordance with the first embodiment of the present invention includes an array of organic EL elements which are discretely arrayed so as not to impair the spatial uniformity of illumination light of the display element, and thereby the accumulation of heat generated during light emission can be suppressed and the deterioration of the light source can be suppressed. By using such a light source, a compact display device having a reduced decrease in brightness can be obtained.

Figure 4:
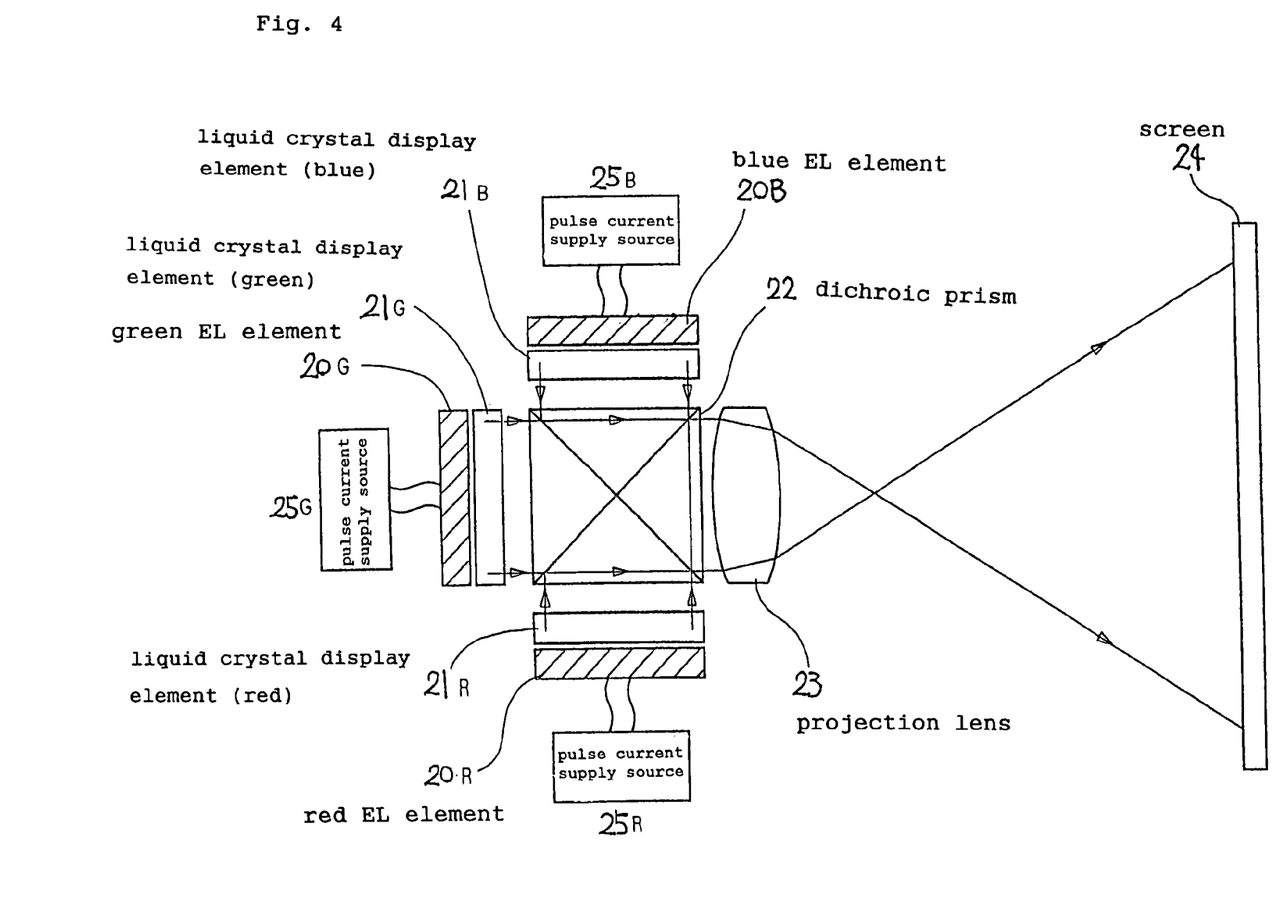
FIG. 4 is a sectional view showing a major optical system in a display device in accordance with a second embodiment of the present invention.

Next, a display device (projection liquid crystal display device) in accordance with a second embodiment of the present invention will be described with reference to FIG. 4 and FIGS. 5A to 5D. FIG. 4 is a sectional view showing a major optical system constituting a projection liquid crystal display device, and FIGS. 5A to 5D are diagrams which show waveforms of pulse currents applied to organic EL elements as light sources to cause light emission.

The structure of the optical system shown in FIG. 4 is substantially the same as that of the display device in the first embodiment. A liquid crystal display element 21R for displaying a red-component image, a liquid crystal display element 21G for displaying a green-component image, and a liquid crystal display element 211B for displaying a blue-component image are disposed opposite to the corresponding faces of a dichroic prism 22. A red organic EL element 20R for emitting light at a wavelength in the red range is disposed at the rear of the liquid crystal display element 21R for displaying the red-component image, a green organic EL element 20G for emitting light at a wavelength in the green range is disposed at the rear of the liquid crystal display element 21G for displaying the green-component image, and a blue organic EL element 20B for emitting light at a wavelength in the blue range is disposed at the rear of the liquid crystal display element 21B for displaying the blue-component image. Images displayed in the individual liquid crystal display elements are illuminated by the corresponding organic EL elements, and a color image is combined by the dichroic prism 22. The color image is enlarged by a projection lens 23 and projected to a screen 24.

The luminescent region is formed uniformly over the entire surface of each organic EL element in this embodiment, and the structure of a luminescent layer preferably includes an optical micro-resonator structure. Due to the optical micro-resonator structure, light having a narrow-band spectrum with a peak at a specific wavelength (for example, at 620 nm in red, at 535 nm in green, and at 470 m in blue) can be emitted, and also the directivity of the emitted light can be strengthened toward the front by the element. A color image having high purity can be displayed by the narrow-band emission spectrum, and the quantity of light which can pass through a projection lens is increased by the strong directivity, and thus a bright image can be displayed.

In particular, in this embodiment, pulse current supply sources 25R, 25G, and 25B are connected to the organic EL elements 20R, 20G, and 20B, respectively, and each organic EL element emits light in a pulsed form.

The size of the display area in each of the liquid crystal display elements 21R, 21G, and 21B is set, for example, at 0.9 inch measured diagonally, and in order to illuminate the area, the size of the luminescent region in each of the organic EL elements 20R, 20G and 20B is set, for example, at 1 inch measured diagonally. When the organic EL element which emits light in such a large luminescent region is operated with a direct current, if a large amount of current is applied in order to produce emission at high luminance, heat is accumulated in the element, and the increased temperature of the element changes the structure of the luminescent material, resulting in a short life of the element. Therefore, it is effective to prevent the accumulation of heat by pulsed operation of the element in order to prolong the life.

The time-averaged luminance of the pulsed-operation organic EL element is the product obtained by multiplying the luminance determined by a peak current of one pulse by the duty of the pulse (the ratio of the period of time for applying the current to the pulse period).

Figure 5A:
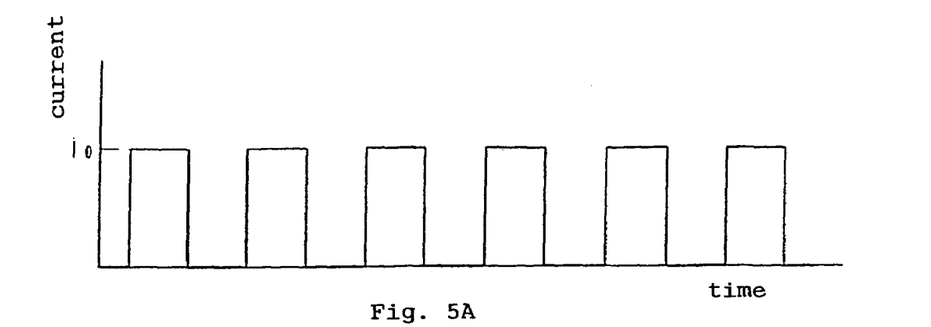
FIGS. 5A to 5D are diagrams which show current waveforms for operating organic EL elements constituting light sources in the display device in accordance with the second embodiment of the present invention.
Figure 5B:
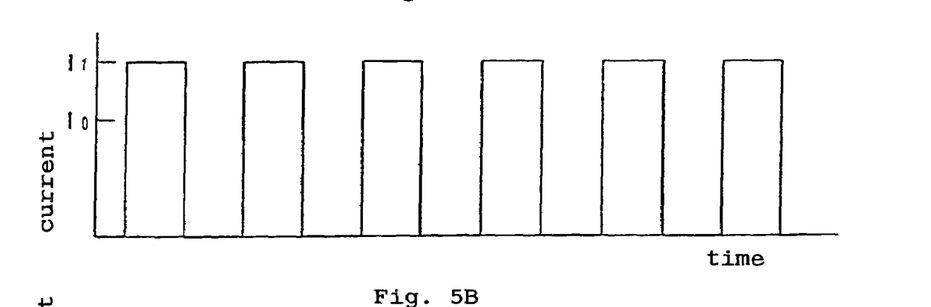
Figure 5C:
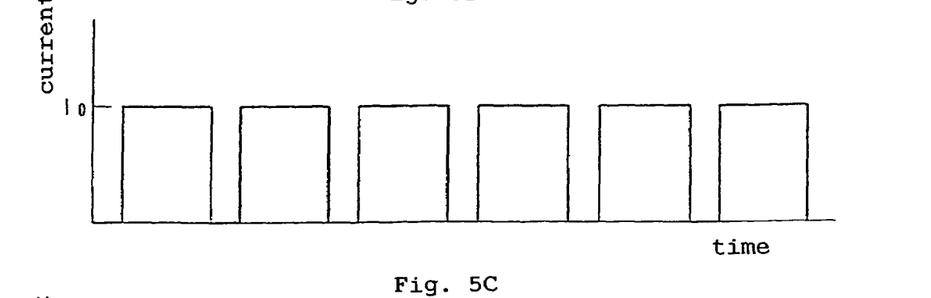
Figure 5D:
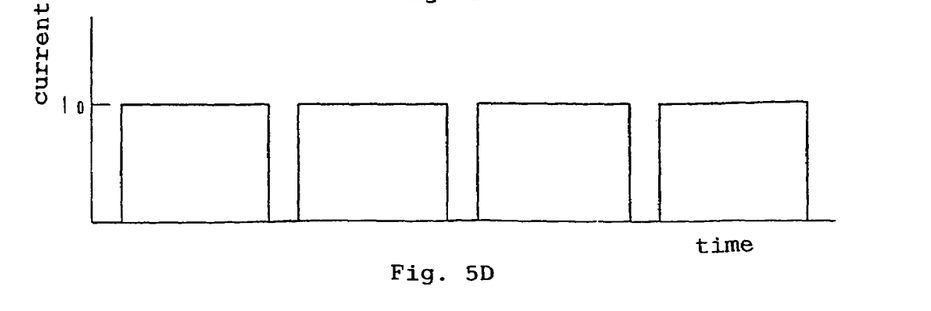

The frequency of the pulse current must be increased to such an extent that flickering is not observed, and is set, for example, at approximately 100 Hz. FIG. 5A shows an example of a waveform of the pulse current, in which the peak current $I_0$ is 0.5 A, the frequency is 100 Hz (period 10 msec), and the duty of the pulse is 50% (pulse width 5 msec).

Since the display device is provided with red, green, and blue organic EL elements, in order to balance the individual colors, the luminance of the individual organic EL elements must be adjusted. While the display device is used, the luminance of the organic EL elements decreases, and since the degree of the decrease in luminance differs among the individual organic EL elements, a way to independently adjust the luminance of the individual organic EL elements is required, although it is not shown in the drawing.

Since each EL element is pulse-operated, it is possible to adjust the luminance by adjusting the peak current of the pulse current or by adjusting the duty of the pulse.

FIGS. 5A to 5D show examples for the above. A pulse current shown in FIG. 5A is considered as a base. In an example shown in FIG. 5B, the period and the duty of the pulse are the same as those of the base, and by increasing the peak current $I_1$ to 0.6 A, the luminance is increased. In an example shown in FIG. 5C, the period of the pulse and the peak current are the same as those of the base, and by increasing the duty of the pulse from 50% to 70%, the luminance is increased. In an example shown in FIG. 5D, the peak current is the same as that of the base, and by decreasing the frequency of the pulse from 100 Hz to 70 Hz and by setting the duty at 80%, the luminance is increased.

Figure 6:
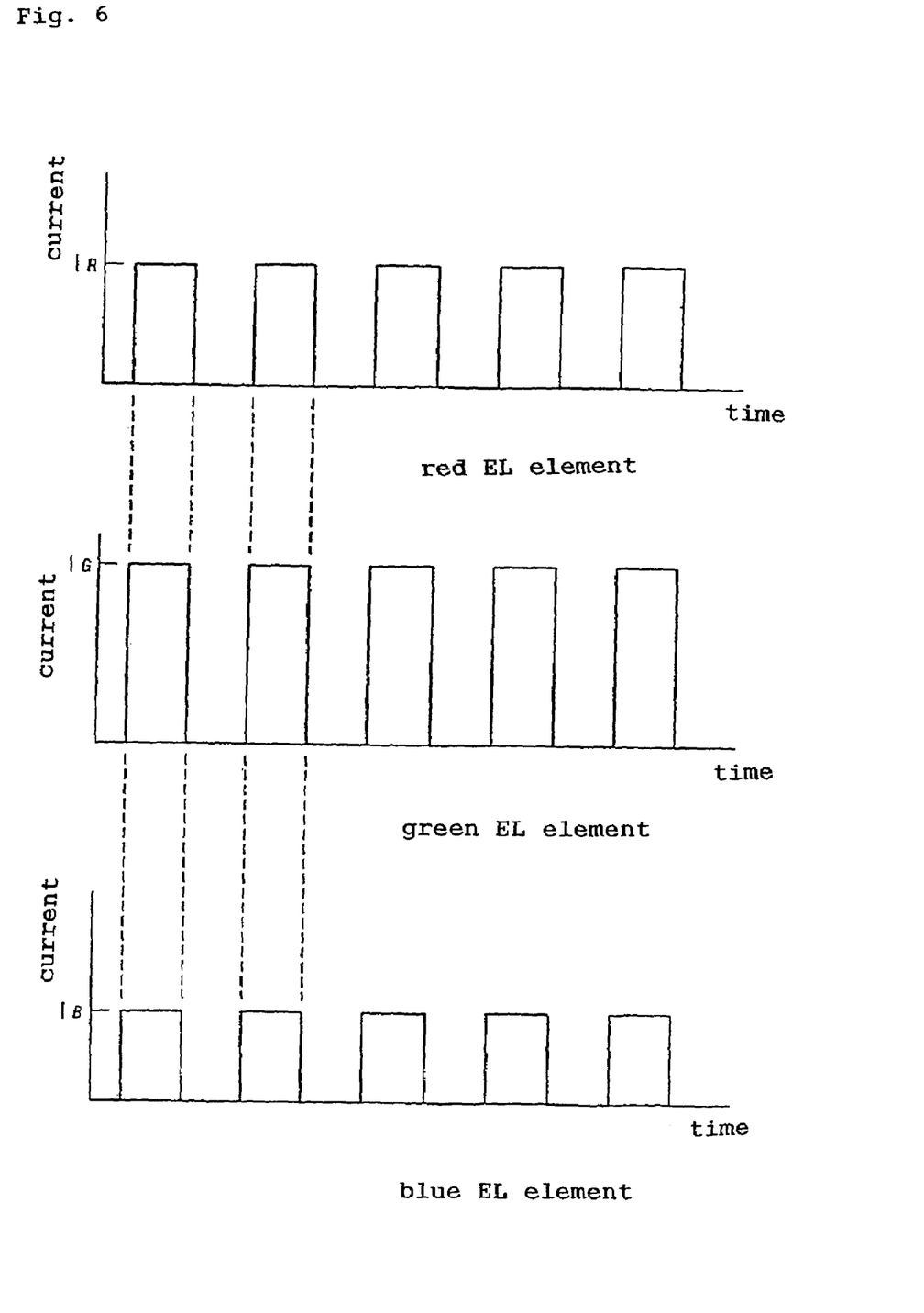
FIG. 6 is a diagram which shows a variation of timing of current waveforms for operating the organic EL elements as light sources in the display device in accordance with the second embodiment of the present invention.

Preferably, pulses are applied to the organic EL elements 20R, 20G, and 20B with the same frequency and with the same timing (phase). FIG. 6 shows an example of such timing at which pulses are applied. In such a case, the luminance is controlled by adjusting the peak values (peak currents $I_R$, $I_G$, and $I_B$) of the pulses applied to the red EL element (20R), the green EL element (20G), and the blue EL element (20B), respectively. In a display device employing such a method of applying pulses, in comparison with the case in which there is a shift in pulses, the degree of color separation is suppressed and the balance of displayed color is improved. Alternatively, with pulses of the same frequency being used, the pulse width may be changed depending on the individual colors R, G, and B to such an extent that visual observation is enabled.

Figure 7:
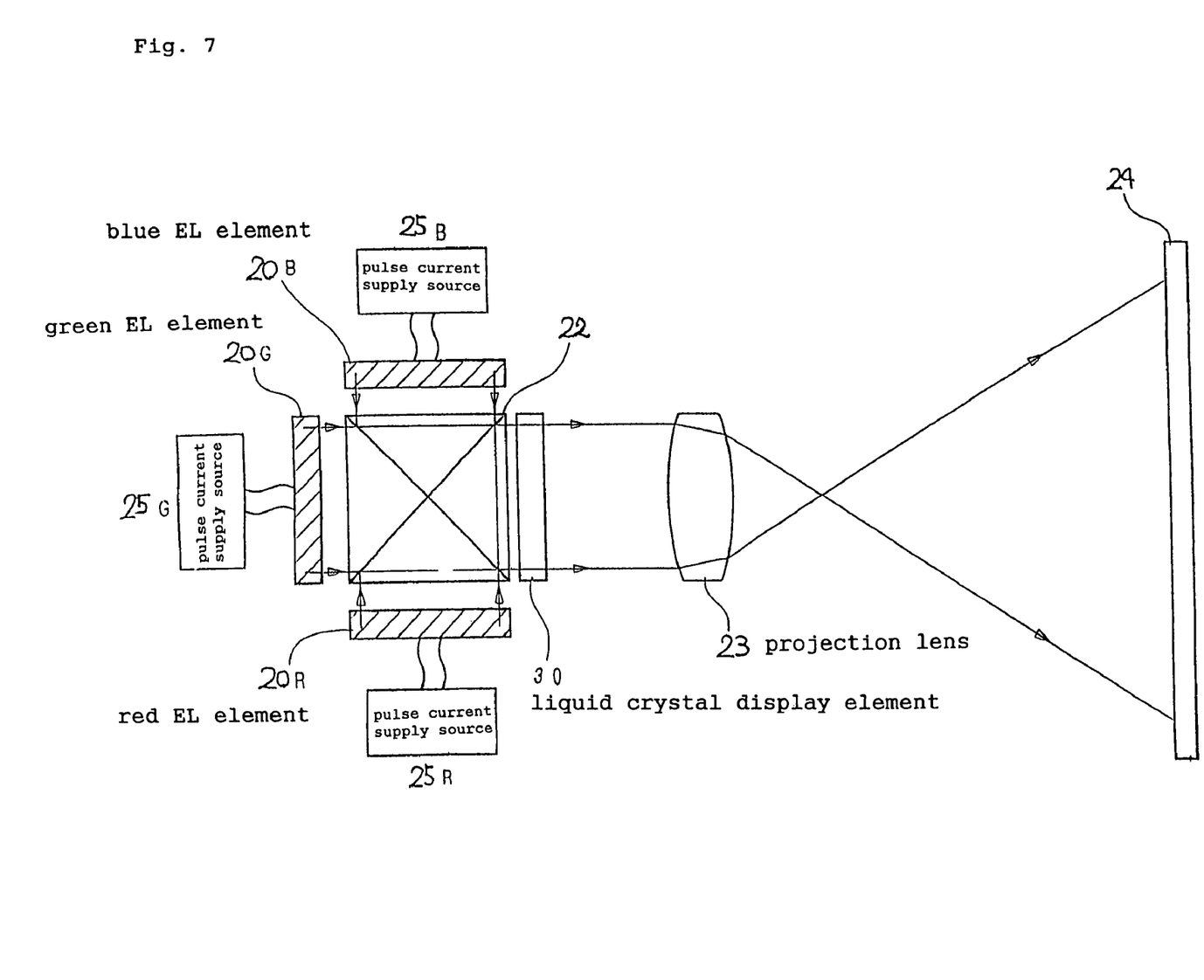
FIG. 7 is a sectional view which shows a major optical system in a display device in accordance with a third embodiment of the present invention.

A display device in accordance with a third embodiment of the present invention will be described with reference to FIG. 7. FIG. 7 is a sectional view showing a major optical system constituting a projection liquid crystal display device. The structure of this embodiment differs from that of the second embodiment in that only one liquid crystal display element 30 is provided.

A red organic EL element 20R for emitting light at a wavelength in the red range, a green organic EL element 20G for emitting light at a wavelength in the green range, and a blue organic EL element 20B for emitting light at a wavelength in the blue range are disposed opposite to the corresponding faces of a dichroic prism 22.

Light emitted from each of the organic EL elements is combined by the dichroic prism 22 and white light is produced. The liquid crystal display element 30, which is disposed opposite to the light-emitting face of the dichroic prism 22, is illuminated by the white light from behind. The liquid crystal display element 30 is provided with color filters in the pixels thereof, and a color image is displayed by the illumination of white light. The image displayed in the liquid crystal display element 30 is enlarged and projected to a screen 24 by a projection lens 23.

Pulse current supply sources 25R, 25G, and 25B are connected to the organic EL elements 20R, 20G, and 20B, respectively, and each organic EL element is pulse-operated and emits light in response to the applied pulse.

Since the display device is provided with red, green, and blue organic EL elements, in order to balance the individual colors, the luminance of the individual organic EL elements must be adjusted. While the display device is used, the luminance of the organic EL elements decreases, and since the degree of the decrease in luminance differs among the individual organic EL elements, a way to independently adjust the luminance of the individual organic EL elements is required.

Since each organic EL element is pulse-operated, as described in the second embodiment, it is possible to adjust the luminance by adjusting the peak current of the pulse current or by adjusting the duty of the pulse. It is also possible to improve the balance of displayed color by applying pulses to the organic EL elements 20R, 20G, and 20B with the same timing (phase).

Figure 8:
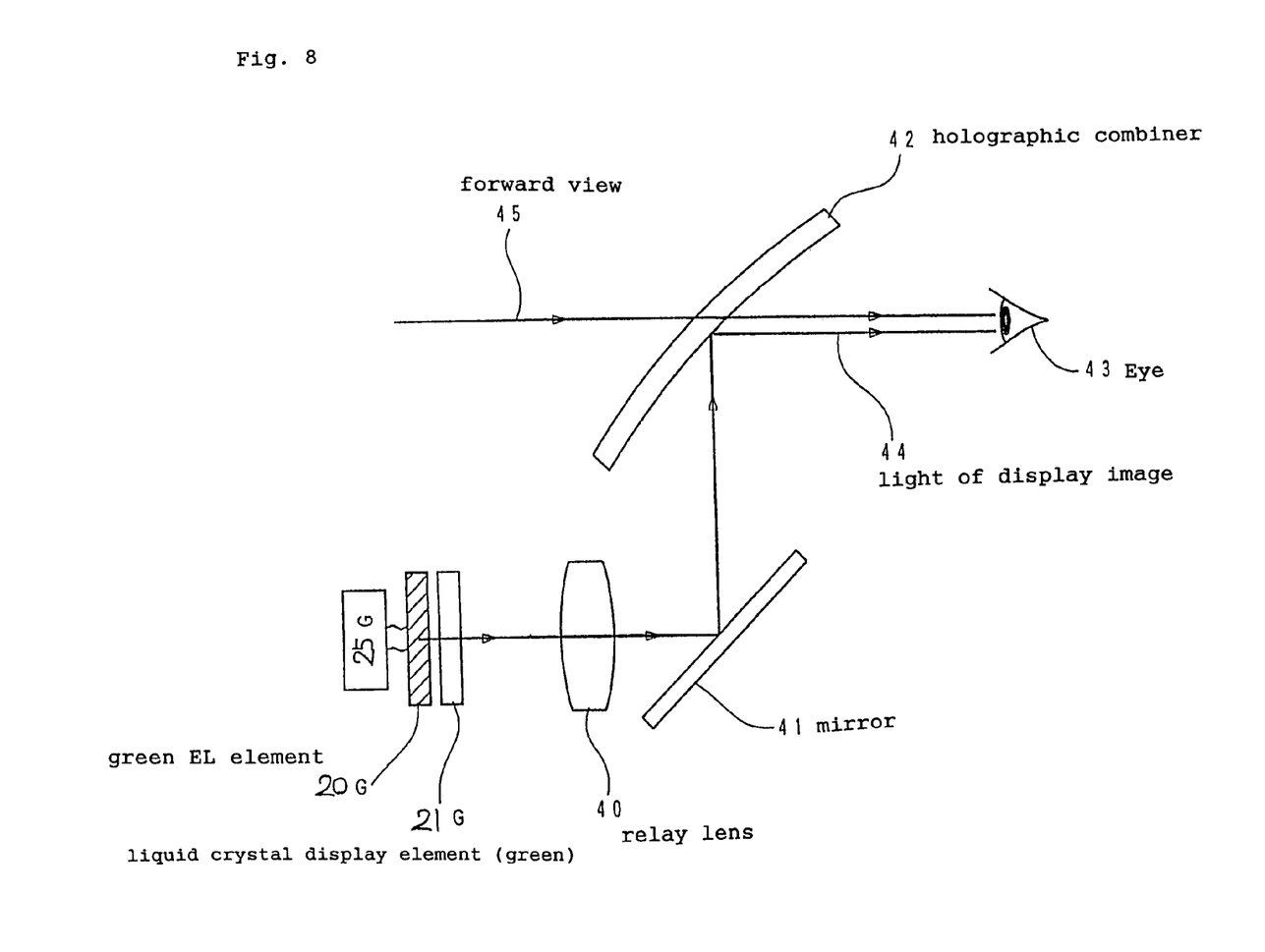
FIG. 8 is a sectional view which shows a major optical system in a display device in accordance with a fourth embodiment of the present invention.

A display device in accordance with a fourth embodiment of the present invention will be described with reference to FIG. 8. The display device in this embodiment is a head-up display in which an image of a liquid crystal element is superimposed on a forward view by a combiner provided on a windshield of a car, and FIG. 8 is a sectional view showing a major optical system thereof. The display device in the embodiment displays a green image only.

A liquid crystal display element 21G is illuminated by an organic EL element 20G for emitting green light which is pulse-operated by a pulse current supply source 25G. An image displayed in the liquid crystal display element 21G is superimposed on a forward view 45 by an optical system including a relay lens 40, a mirror 41, and a concave holographic combiner 42 and appears in the space in front of the holographic combiner.

The organic EL element 20G is provided with a micro-resonator in the structure of a luminescent layer thereof, and can emit light having a narrow-band spectrum with a peak at a specific wavelength (for example, at 535 nm). Since the holographic combiner 42 is a holographic element, the optical properties thereof are sensitive to changes in wavelength, and the occurrence of aberrations can be suppressed as the emission spectrum of the light source is narrowed. From this viewpoint, the combination of the holographic combiner and the organic EL element having the micro-resonator structure is advantageous in the head-up display.

Figure 9:
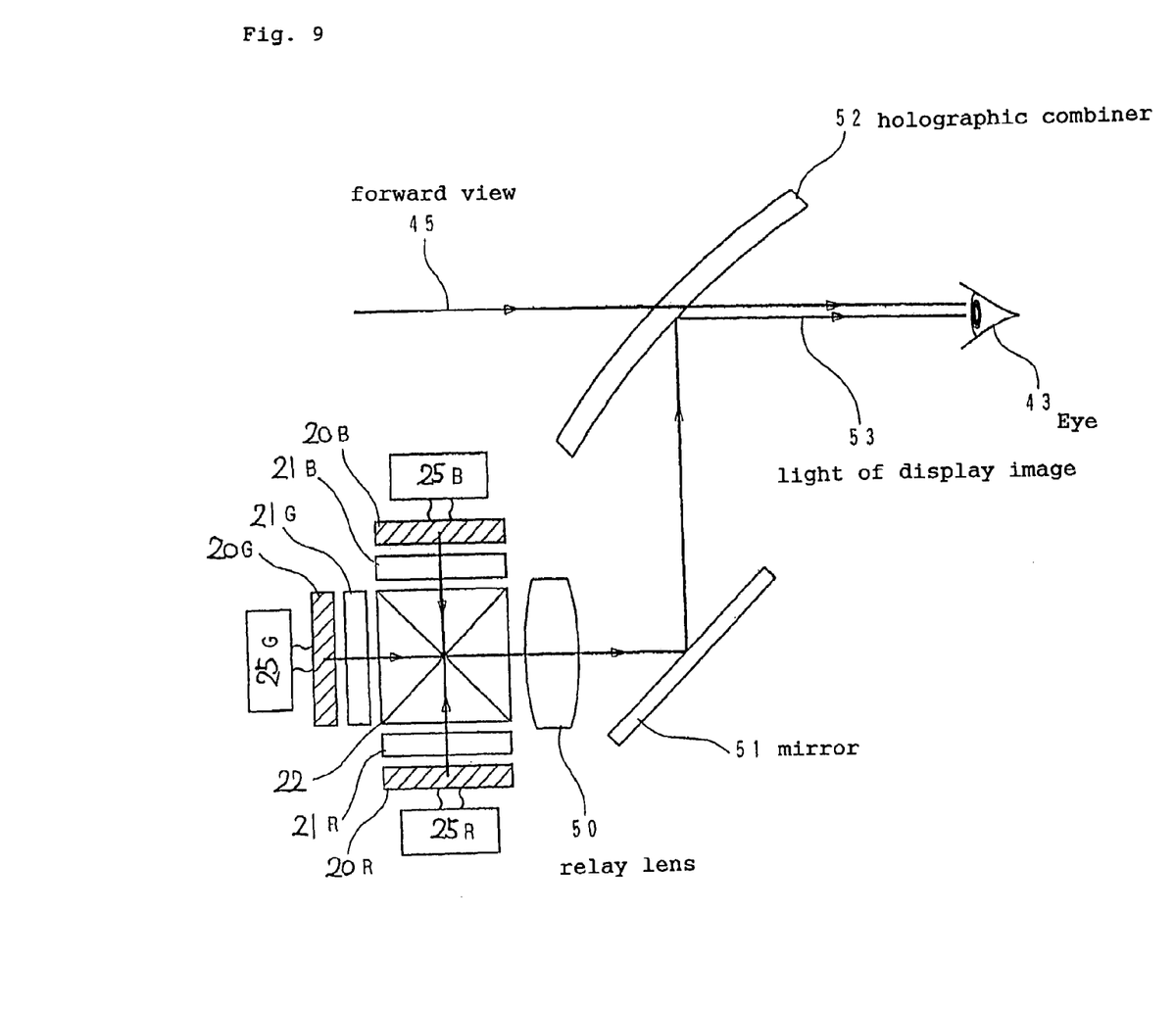
FIG. 9 is a sectional view which shows a major optical system in a display device in accordance with a fifth embodiment of the present invention.

A display device in accordance with a fifth embodiment of the present invention will be described with reference to FIG. 9. The display device in this embodiment is a head-up display in which an image of a liquid crystal element is superimposed on a forward view by a combiner in a similar manner to that of the fifth embodiment, and FIG. 9 is a sectional view showing a major optical system thereof. The head-up display of this embodiment displays a color image.

A section for producing a display image, which has the same structure as that in the second embodiment, includes liquid crystal display elements 21R, 21G, and 21B corresponding to the three primary colors disposed around a dichroic prism 22, and a red organic EL element 20R, a green organic EL element 20G, and a blue EL element 20B which are disposed at the rear thereof, respectively. The individual organic EL elements are pulse-operated by pulse current supply sources 25R, 25G, and 25B.

A color image combined by the dichroic prism 22 is superimposed on a forward view 45 by an optical system that includes a relay lens 50, a mirror 51, and a concave holographic combiner 52 and appears in the space in front of the holographic combiner.

Each of the three organic EL elements 20R, 20G, and 20B is provided with a micro-resonator in the structure of a luminescent layer thereof, and light having a narrow-band spectrum with a peak at a specific wavelength (for example, at 620 nm, 535 nm, and 470 mm) can be emitted. By constructing the holographic combiner 52 with the combination of holographic elements in which the reflection properties are optimized for the individual wavelengths, light having three wavelengths from the individual organic EL elements is reflected, and light having wavelengths in the other ranges is transmitted. In the combiner thus designed, the reflectance with respect to light of a display image 53 is increased and the transmittance with respect to light of a forward view 45 is increased, and thus it is possible to produce display by superimposing a bright display image on a bright forward view.

Although the combination of a holographic combiner and a relay lens is used as the optical system for displaying an image of the liquid crystal display element in the space in front in the fourth and fifth embodiments, it may be also possible to employ an optical system in which a combiner that includes a dielectric multilayered film having a high reflectance for a specific wavelength and an appropriate lens system are combined.

Next, a display device in accordance with a sixth embodiment of the present invention will be described. The basic structure of the display device of this embodiment is the same as that shown in FIG. 4 in the second embodiment. A difference between the two is in the internal structures of light sources that include organic EL elements (20R, 20G, and 20B). That is, in this embodiment, each of the organic EL elements constituting the light sources has a structure that includes one-dimensional luminescent sections in a striped pattern as shown in FIG. 3, and pulse operation is performed by the pulse current supply sources (25R, 25G, and 25B) connected to the individual EL elements shown in FIG. 4.

In the light source in this embodiment, the luminescent sections of the organic EL elements are discretely arrayed, and a passage for dissipating heat generated during the emission of the EL elements is formed. The organic EL elements generate heat intermittently because the elements are pulse-operated, and the accumulation of heat of the entire light source resulting from the array of the EL elements can be greatly prevented. Moreover, in the display device, the life of the light source can be prolonged, and display with stable luminance can be produced.

Additionally, in this embodiment although the one-dimensional striped pattern is used for the luminescent sections that includes the organic EL elements in the light sources, it is possible to use a light source in which luminescent sections are two-dimensionally arrayed as shown in FIG. 2 as employed in the first embodiment. Furthermore, in pulsed operation, preferably, pulses are applied to the light sources that includes the organic EL elements (20R, 20G, and 20B) with the same frequency and with the same timing (phase) as shown in FIG. 6. In such a case, the luminance can be controlled by adjusting the peak values (peak currents $I_R$, $I_G$, and $I_B$) of the pulses. In a display device employing such a method of applying pulses, in comparison with the case in which there is a shift in pulses, the degree of color separation is lowered and the balance of displayed color is further improved. Alternatively, with the pulses with the same frequency being used, the pulse width may be changed depending on the individual colors R, G, and B to such an extent that visual observation is enabled.

Although the combination of the array of the organic EL elements in the light sources and the pulse operation in this embodiment is employed in the structure shown in FIG. 4 in which a liquid crystal display element is provided for a light source of each color, the feature may also be applicable to the structure as shown in FIG. 7 in which combined light from the light sources of the individual colors is applied to one liquid crystal display element.

As described above, in the second to sixth embodiments, although three liquid crystal display elements and three organic EL elements for displaying red, green, and blue, respectively, are used in order to produce color display, it may be possible to construct a display device using the combination of only two colors, such as red and green.

The present invention is not limited to the second to sixth embodiments, and is applicable to display devices using organic EL elements as light sources, and also is applicable to display devices such as viewfinders of video cameras in which an enlarged virtual image of a liquid crystal display element is viewed through a lens. As the display element, instead of the liquid crystal display element, a spatial light modulator in which, in particular, transmitted light can be modulated may be used.

In accordance with the display devices of the second to sixth embodiments, with respect to display devices in which display elements are illuminated using organic EL elements, each for emitting light of red, green, or blue with high luminance, the deterioration of the organic EL elements due to the accumulation of heat can be suppressed, and the color balance between the individual organic EL elements can be adjusted by controlling the peak current and the duty of the pulse current.

What is claimed is:

1. A light source, comprising: a plurality of electroluminescent elements arrayed in a common plane parallel to a support surface of a substrate, the plurality of electroluminescent elements emitting light simultaneously, P being a distance in the common plane between centers of adjacent electroluminescent elements and D being a distance between each electroluminescent element and a display surface of a liquid crystal display element, and a relationship between D and P being such that D is 10 times P or more.

2. The light source according to claim 1, the plurality of electroluminescent elements emitting light of one primary color.

3. The light source according to claim 1, the electroluminescent elements comprising optical micro-resonators.

4. The light source according to claim 1, the electroluminescent elements being formed on the substrate at the intersections of an anode formed in a striped pattern in a first direction and a cathode formed in a striped pattern in a second direction orthogonal to the first direction.

5. The light source according to claim 1, the electroluminescent elements being one-dimensionally arrayed on the substrate.

6. The light source according to claim 1, the electroluminescent elements being two-dimensionally arrayed on the substrate.

7. A display device for illuminating a liquid crystal display element, comprising: the light source according to claim 1.

8. The display device according to claim 1, all of the electroluminescent elements on the substrate emitting light simultaneously.

* * * * *